United States Patent [19]
Bailey et al.

[11] Patent Number: 5,963,420
[45] Date of Patent: Oct. 5, 1999

[54] INTERLOCK BYPASS

[75] Inventors: James Rodney Bailey, Brevard; Douglas Eugene Frushour, Asheville; Alfred Lee Randall, Horshshoe, all of N.C.

[73] Assignee: Eaton Corporation, Cleveland, Ohio

[21] Appl. No.: 08/934,881

[22] Filed: Sep. 22, 1997

[51] Int. Cl.[6] .......................... H02B 11/133; H05K 5/02; H05K 5/03; H01H 9/20
[52] U.S. Cl. .......................... 361/616; 361/609; 361/615; 361/732; 361/740; 200/50.02; 200/50.03
[58] Field of Search .................... 361/616, 609, 361/615, 726, 732, 740, 747; 454/184–186; 312/223.1, 223.2; 165/80.2, 80.3, 104.34, 185; 200/50.01, 50.02, 50.03, 50.11, 50.12, 50.13, 50.14, 50.18, 50.19, 50.4

[56] References Cited

U.S. PATENT DOCUMENTS

| | | | |
|---|---|---|---|
| 1,412,488 | 4/1922 | Pickareck | 200/50.15 |
| 1,561,248 | 11/1925 | Krantz | 200/50.13 |
| 1,730,311 | 10/1929 | Baxter et al. | 200/449 |
| 2,695,934 | 11/1954 | Wills | 200/50.19 |
| 2,851,548 | 9/1958 | Edmunds | 200/50.03 |
| 3,171,908 | 3/1965 | Malota | 200/50.18 |
| 4,079,214 | 3/1978 | Castonguay et al. | 200/50 A |

*Primary Examiner*—Leo P. Picard
*Assistant Examiner*—Anatoly Vortman
*Attorney, Agent, or Firm*—Martin J. Moran

[57] ABSTRACT

An electrical apparatus housing having a door for accessing the apparatus within the interior of the housing and a switch for activating the apparatus accessible from the exterior of the housing. When in the on position, the switch is operable to block the door from being opened; thus functioning as an interlock to prevent access to the interior of the housing when the apparatus is activated. The invention includes a key for bypassing the interlock so that under certain circumstances the housing door can be opened while the equipment is operating, so it can be tested in its energized state.

3 Claims, 2 Drawing Sheets

INTERLOCK BYPASS

BACKGROUND OF THE INVENTION

1. Field of the Invention

This invention relates generally to enclosures housing electrical apparatus and more particularly to such enclosures that include access doors that are sealed by interlocks when the apparatus is energized.

2. Background Information

Medium voltage motor control equipment (2,300V to 7,200V) typically include a mechanical interlock to prevent entry into a medium voltage motor starter without first de-energizing or shutting down the power to the starter circuit. The standards for this type of equipment do, however, allow for this mechanical interlock to be bypassed if certain conditions are met. For example, at times it is desirable to have access to the contactor, isolation switch, fuses, etc., which are contained behind the medium voltage control equipment housing door, for the purpose of taking infrared pictures of these components while the starter is energized. These pictures permit engineering analysis of potential problem areas where "hot" spots or overheating can at times occur. Correcting these problem areas before they cause damage can save money on equipment and maintenance costs, as well as prevent hazardous conditions from developing that can otherwise affect the personnel handling the equipment. Accordingly, it would be desirable to provide controlled access to the components within the housing while the equipment is operating. It is also desirable to provide such access in a manner that would not permit the interior of the housing to be exposed inadvertently while the equipment is activated.

SUMMARY OF THE INVENTION

This invention provides a mechanism for unlocking a housing enclosing electrical equipment, which is normally locked when the equipment is energized. Preferably the interlock is unlocked with a key that prevents inadvertent and unintentional access to the equipment while it's operating.

In one preferred embodiment a control switch, used to activate the electrical equipment, blocks the access door to the housing when the switch is in its on position, and thus functions as an interlock. The portion of the door that interfaces with the switch is a slide plate normally maintained in a closed position. A key inserted into a keyway in the housing couples with a mechanical arm extending between the key receptacle and the slide plate, which drives the slide plate in the direction of key movement to open the area on the surface of the door that is blocked by the switch; removing the obstruction to opening the door. Preferably, the slide plate is biased in the closed position.

These and other objects, features, and advantages of the present invention, will become apparent to those skilled in the art upon a reading of the following description when taken in conjunction with the drawings wherein there is shown and described illustrative embodiments of the invention.

BRIEF DESCRIPTION OF THE DRAWINGS

While the specification concludes with claims specifically pointing out and distinctly claiming the subject matter of the invention, it is believed that the invention will better be understood from the following description, taken in conjunction with the accompanying drawings wherein:

DESCRIPTION OF THE PREFERRED EMBODIMENTS

Medium voltage motor control equipment typically includes a mechanical interlock to prevent entry into the enclosure housing the medium voltage motor starter, without first de-energizing or shutting down power to the starter circuit. The standards for this type of equipment do, however, allow for this mechanical interlock to be bypassed under certain conditions.

The purpose of this invention is to provide a mechanism to bypass the mechanical interlocks built into such equipment. For example, access while the equipment is energized can be useful to a user in order to view the contactor, isolation switch, fuses, etc., which are contained behind the medium voltage equipment enclosure door, for purpose of taking infrared pictures of these components while the starter is energized. These pictures permit engineering analysis of potential problem areas where "hot" spots or overheating can occur. Correcting these problem areas before there is significant deterioration of the components can save money on equipment and maintenance costs as well as prevent abnormal conditions that have a potential to otherwise adversely affect employees operating the equipment.

This invention permits access to the interior of the equipment housing without de-energizing the equipment. While the invention is illustrated in an application to medium voltage motor control equipment or starter, it should be appreciated that it can be applied to any piece of operating apparatus with an interlock that seals the housing while the equipment is functioning.

Figure 1:
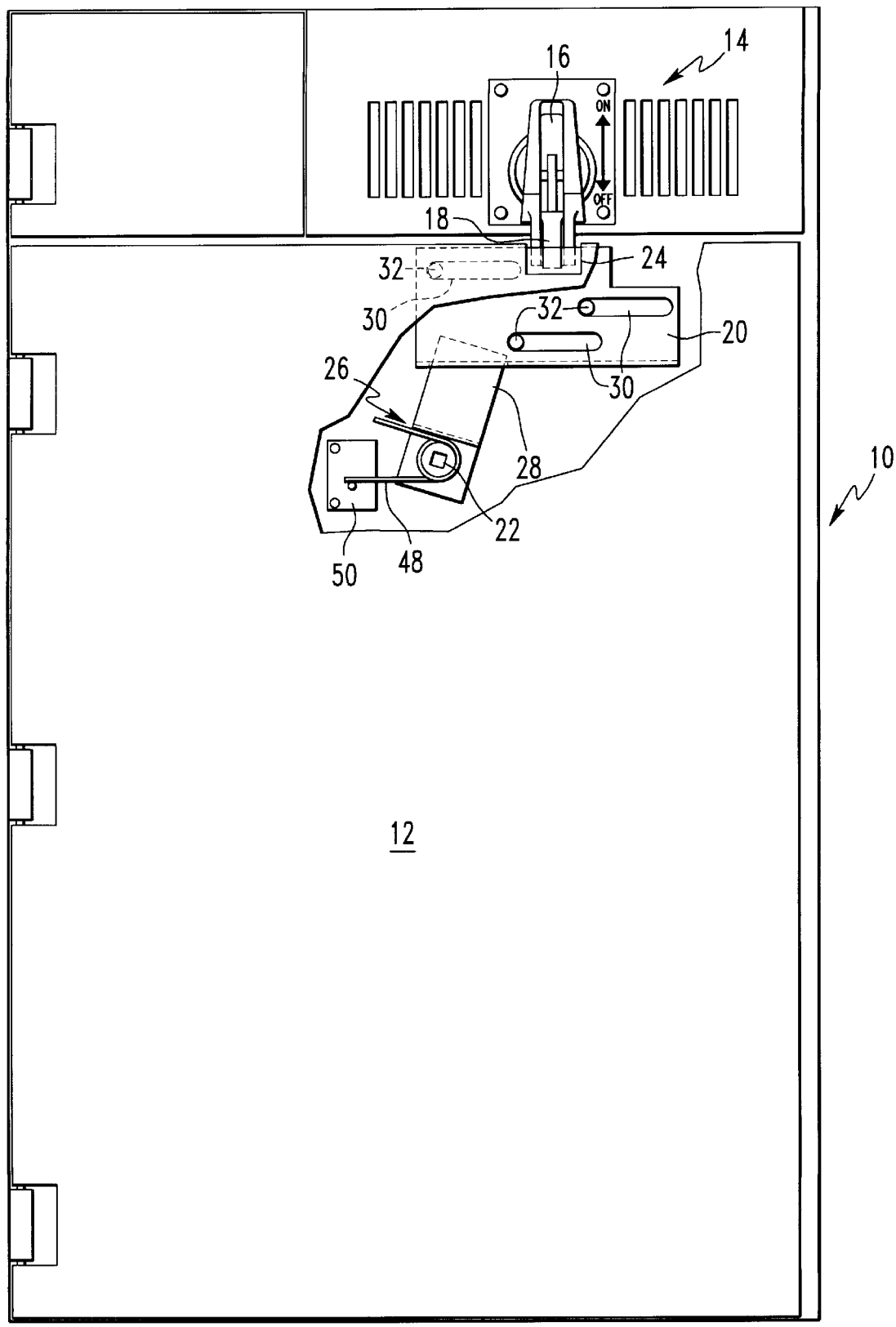
FIG. 1 is a planned view of a medium voltage motor control equipment housing.

FIG. 1 illustrates a housing cabinet designed to house medium voltage motor control equipment and is designated generally by reference character 10. In one prior art embodiment, on existing housing doors 12, a portion of the isolation switch 14 extends over a section of the door 12, when the isolation switch handle 16 is in the on position, to block the door from being opened. In this illustrative example the protruding portion 18 of the switch handle 16 forms the obstruction which blocks the door 12 when the switch 16 is in the on position. To allow the door 12 to be opened the isolation switch 16 must be moved to the off position which rotates the protruding portion of the handle 18 out of interference with the door 12.

The improvement provided by this invention in this embodiment employs the isolation switch 16 as described above. However, the need to move the isolation switch to the off position to gain access to the medium voltage equipment can be bypassed if desired by using a special tool which is designed to be inserted into a keyway 22. When the tool is rotated in the keyway 22 it drives the moveable plate 20 out of interference with the handle portion 18 and enables the door 12 to be opened, as will be appreciated from the following description.

In accordance with this preferred embodiment of the invention, the portion 24 of the door 12 which is covered by the isolation switch handle extension 18 is notched. The notch allows the door 12 to swing open, clearing the isolation switch handle portion 18 when the handle is in the on position. A slide plate or moveable panel 20 is attached to the door, and normally seats over the notched portion 24 of the door and performs the same function as the door portion that it replaces. The slide plate 20 is operated by a drive mechanism 26 which normally biases the slide plate in the closed position, covering the notch 24. The slide plate 20 can be moved out of the way of the handle portion 18 by inserting a special tool or key into the keyway 22 and turning the tool counterclockwise which rotates the moveable arm 28 in the same direction. The drive arm 28, at an extended portion from the keyway 22 is captured within a slot 40 within the moveable panel 20. Rotation of the keyway 22 and thus the drive arm 28 causes the moveable panel 20 to slide to the left, guided by slots 32 which are formed in the panel parallel to the direction of movement and ride over guide pins 32 which are secured to the door 12. Once the slide plate is moved, the door notch 24 is exposed thus allowing the door to clear the extended portion 18 of the switch handle 16 and open without changing the status of the isolation switch 16.

Figure 2:
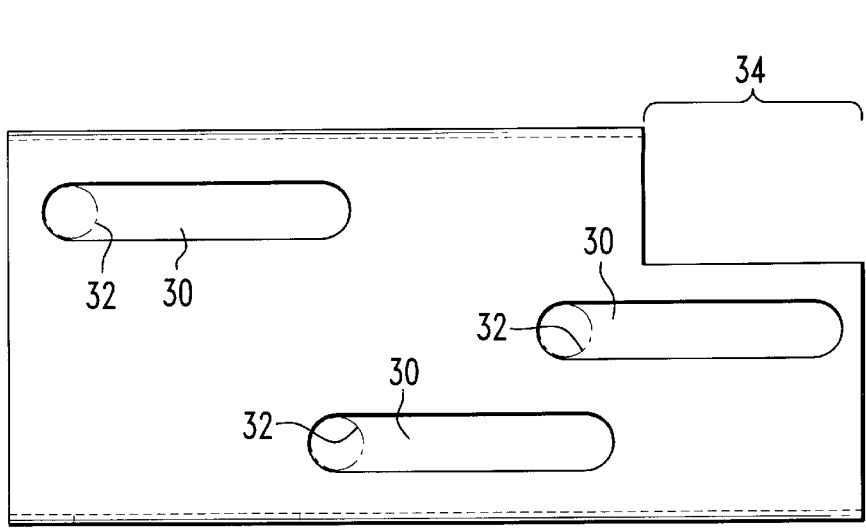
FIG. 2 is a layout view of the slide plate shown in FIG. 1.

FIG. 2 is a planned view of the moveable panel 20 showing the guide slots 30 and a reduced width section 34 on the panel 20 which helps to support the panel on either side of the door notched section 24 when the panel is fully open, while enabling the notched section 24 to remain clear of obstruction.

Figure 3:
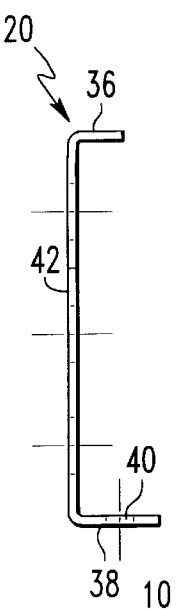
FIG. 3 is an end view of the slide plate shown in FIG. 2.
Figure 4:
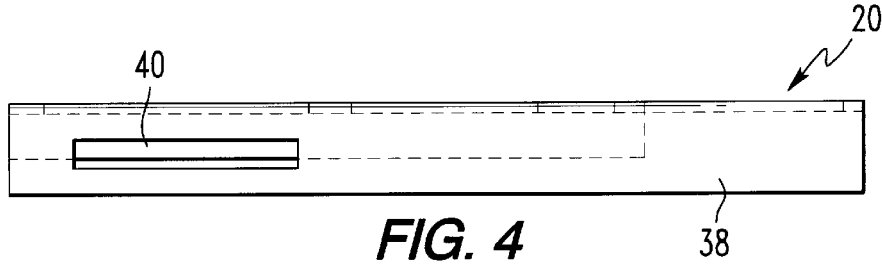
FIG. 4 is a bottom view of the slide plate shown in FIGS. 2 and 3.

FIG. 3 shows a side view of the moveable panel 20 shown in FIG. 2. Referring to FIG. 3 it can be appreciated that both the top and bottom sections 36 and 38 of the moveable panel 20 are bent at right angles to the main body 42 to add rigidity to the structure. The lower angular member 38 is larger than the upper angular member 36 and includes a slot 40 which captures a peripheral portion of the drive arm 28, not shown but previously described, which drives the moveable panel in its open and closed directions. The slot 40 can better be appreciated from the bottom view of FIG. 2 shown in FIG. 4.

Figure 6:
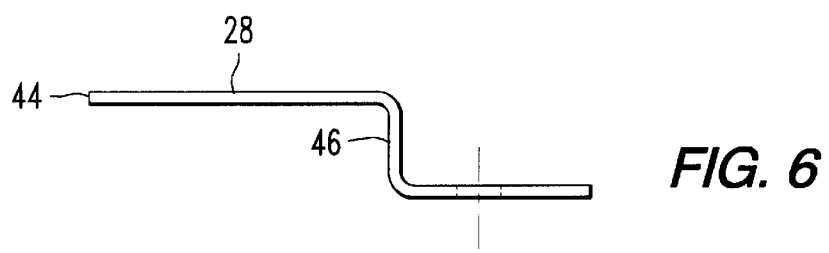
FIG. 6 is a side view of the activation arm shown in FIG. 5.
Figure 5:
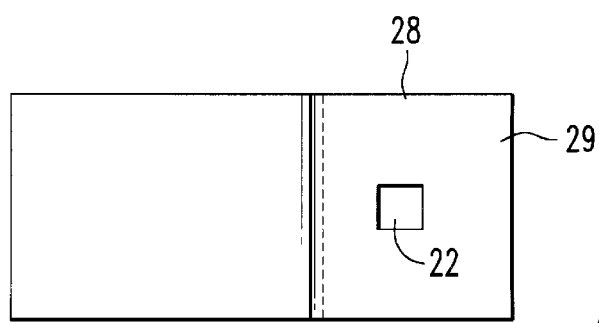
FIG. 5 is a planned view of the activation arm shown in FIG. 1.

FIGS. 5 and 6 show a planned view and side view of the drive arm 28. In this embodiment the keyway 22, previously shown in FIG. 1, can be a conventional lock having a tumbler with a rectangular extension that captures the square hole 29 in the drive arm 28 shown in FIGS. 5 and 6. As can best be appreciated from FIG. 6, the drive arm 28 is offset at portion 46 so that its extended end can be captured in the slot 40 of the moveable panel 20. Thus, rotating the keyway 22 of the drive arm 28 rotates the drive arm and moves the moveable member 20 in a direction to clear the notched portion 24 in the door 12.

Referring back to FIG. 1, it can be appreciated that the drive arm 28 is connected to an anchor plate 50 fastened to the door 12, by way of a spring 48. The spring normally biases the moveable panel 20 in a closed position to cover the door notch 24. In this way access to the interior of the enclosure is restricted by the interlock 18 when the isolation switch is in the on position, unless the invention is intentionally activated to bypass the interlock.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breath of the claims appended and any and all equivalents thereof. For example, the interlock bypass of this invention can work as well with a number of other interlock arrangements such as those that are electro-mechanically activated by rotation of the switch.

What is claimed is:

1. A housing enclosing an electrical apparatus comprising:
   an enclosure housing said apparatus;
   a door on said enclosure operable to open to gain access to said apparatus;
   a switch on said enclosure accessible with the door closed to activate said apparatus when the switch is in an on position;
   an interlock activated by said switch when in the on position to block the door from being opened;
   a moveable panel in said door interfacing with said interlock to block said door and operable upon command to move the panel to unlock the interlock when said switch is in the on position; and
   an aperture in said door forming a keyway and a moveable arm affixed to said keyway at one location along the arm and interfacing with said moveable panel at another location along the arm and operable to open said panel.

2. A housing enclosing an electrical apparatus comprising:
   an enclosure housing said apparatus;
   a door on said enclosure operable to open to gain access to said apparatus;
   a switch on said enclosure accessible with the door closed to activate said apparatus when the switch is in an on position;
   an interlock activated by said switch when in the on position to block the door from being opened;
   a moveable panel in said door interfacing with said interlock to block said door and operable upon command to move the panel to unlock the interlock when said switch is in the on position;
   wherein the moveable panel includes a slot that rides over a corresponding guide affixed to the door; and
   wherein the guide comprises a pin that the slot moves over.

3. A housing enclosing an electrical apparatus comprising:
   an enclosure housing said apparatus;
   a door on said enclosure operable to open to gain access to said apparatus;
   a switch on said enclosure accessible with the door closed to activate said apparatus when the switch is in an on position;
   an interlock activated by said switch when in the on position to block the door from being opened;
   a moveable panel in said door interfacing with said interlock to block said door and operable upon command to move the panel to unlock the interlock when said switch is in the on position;
   wherein the moveable panel includes a slot that rides over a corresponding guide affixed to the door; and
   wherein the moveable panel includes a plurality of parallel slots that define the direction of movement of the panel.

* * * * *